United States Patent
Masumori et al.

(10) Patent No.: US 10,046,418 B2
(45) Date of Patent: Aug. 14, 2018

(54) ELECTRICALLY CONDUCTIVE PASTE, AND ELECTRICALLY CONDUCIVE CONNECTION MEMBER PRODUCED USING THE PASTE

(75) Inventors: Shunji Masumori, Tokyo (JP); Toshiaki Asada, Tokyo (JP); Hidemichi Fujiwara, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 951 days.

(21) Appl. No.: 13/634,057

(22) PCT Filed: Mar. 18, 2011

(86) PCT No.: PCT/JP2011/001615
§ 371 (c)(1),
(2), (4) Date: Sep. 11, 2012

(87) PCT Pub. No.: WO2011/114747
PCT Pub. Date: Sep. 22, 2011

(65) Prior Publication Data
US 2013/0001774 A1    Jan. 3, 2013

(30) Foreign Application Priority Data
Mar. 18, 2010    (JP) .................................. 2010-061838

(51) Int. Cl.
*H01B 1/02*    (2006.01)
*H01L 23/485*    (2006.01)
(Continued)

(52) U.S. Cl.
CPC ........... *B23K 35/0244* (2013.01); *H01B 1/22* (2013.01); *H01L 21/4853* (2013.01);
(Continued)

(58) Field of Classification Search
CPC ......... H01L 2924/013; H01L 2924/014; H01L 2924/01325; H01L 21/4853; H01L 24/81; H01L 23/4924; H05K 2203/0338
See application file for complete search history.

(56) References Cited

U.S. PATENT DOCUMENTS

2005/0194577 A1    9/2005    Kasuga et al.
2007/0152016 A1*   7/2007    Choe et al. .................. 228/56.3
(Continued)

FOREIGN PATENT DOCUMENTS

JP    10-21744 A    1/1998
JP    10-021744 A   1/1998
(Continued)

OTHER PUBLICATIONS

First Notification of Reasons for Refusal for CN Patent Application 201180014310.3, dated Feb. 26, 2014, State Intellectual Property Office of China.
(Continued)

*Primary Examiner* — Julio J Maldonado
*Assistant Examiner* — Abbigale Boyle
(74) *Attorney, Agent, or Firm* — Kubotera & Associates, LLC (57) ABSTRACT

Providing the conductive paste for the material forming the conductive connecting member without disproportionately located holes (gaps), coarse voids, and cracks, which improves thermal cycle and is excellent in crack resistance and bonding strength. An conductive paste including metal fine particles (P) comprising metal fine particles (P1) of one or more than two kinds selected from metal and alloy thereof, having mean primary particle diameter from 1 to 150 nm, and metal fine particles (P2) of same metal as the metal fine particles (P1), having mean primary particle diameter from 1 to 10 μm, mixing ratio of (P1/P2) being
(Continued)

5 μm from 80 to 95 mass % for P1 and from 20 to 5 mass % for P2 (a total of mass % being 100 mass %); and organic dispersion medium (D) comprising organic solvent (S), or organic solvent (S) and organic binder (B), mixing ratio (P/D) of the metal fine particles (P) and the organic dispersion medium (D) being from 50 to 85 mass % for P and from 50 to 15 mass % for D (a total of mass % being 100 mass %).

31 Claims, 1 Drawing Sheet

(51) Int. Cl.
*B23K 35/02* (2006.01)
*H01L 21/48* (2006.01)
*H05K 3/34* (2006.01)
*H01B 1/22* (2006.01)
*H01L 23/00* (2006.01)

(52) U.S. Cl.
CPC ............ *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H05K 3/3484* (2013.01); *H01L 24/03* (2013.01); *H01L 24/05* (2013.01); *H01L 24/11* (2013.01); *H01L 24/45* (2013.01); *H01L 24/48* (2013.01); *H01L 2224/0345* (2013.01); *H01L 2224/0401* (2013.01); *H01L 2224/04026* (2013.01); *H01L 2224/05644* (2013.01); *H01L 2224/1132* (2013.01); *H01L 2224/133* (2013.01); *H01L 2224/1329* (2013.01); *H01L 2224/16225* (2013.01); *H01L 2224/16227* (2013.01); *H01L 2224/16505* (2013.01); *H01L 2224/2732* (2013.01); *H01L 2224/293* (2013.01); *H01L 2224/2929* (2013.01); *H01L 2224/29101* (2013.01); *H01L 2224/32225* (2013.01); *H01L 2224/32505* (2013.01); *H01L 2224/45144* (2013.01); *H01L 2224/48227* (2013.01); *H01L 2224/48644* (2013.01); *H01L 2224/8184* (2013.01); *H01L 2224/81121* (2013.01); *H01L 2224/81191* (2013.01); *H01L 2224/81192* (2013.01); *H01L 2224/81203* (2013.01); *H01L 2224/8384* (2013.01); *H01L 2224/83191* (2013.01); *H01L 2224/83192* (2013.01); *H01L 2224/83203* (2013.01); *H01L 2924/014* (2013.01); *H01L 2924/01005* (2013.01); *H01L 2924/01006* (2013.01); *H01L 2924/01014* (2013.01); *H01L 2924/01028* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/01082* (2013.01); *H01L 2924/10253* (2013.01); *H01L 2924/12042* (2013.01); *H01L 2924/15747* (2013.01); *H01L 2924/35121* (2013.01)

(56) References Cited

U.S. PATENT DOCUMENTS

2008/0014359 A1   1/2008  Kamada et al.
2010/0009153 A1*  1/2010  Yang et al. ................. 428/220

FOREIGN PATENT DOCUMENTS

| JP | 2003-174055 A | 6/2003 |
| JP | 2004-111253 A | 4/2004 |
| JP | 2005-216508 A | 8/2005 |
| JP | 2006-202944 A | 8/2006 |
| JP | 2006-321948 A | 11/2006 |
| JP | 2007-035353 A | 2/2007 |
| JP | 2008-138286 A | 6/2008 |
| JP | 2009176608 A * | 8/2009 |
| JP | 2009-302511 A | 12/2009 |
| KR | 1020060101570 A | 9/2006 |

OTHER PUBLICATIONS

Extended Euopean Search Report for PCT/JP2011001615, dated May 8, 2014,European Patent Office.
Office action for Japanese patent application 2011-535811, dated Feb. 22, 2012, Japan Patent Office.
Third Notification of Reasons for Refusal for CN Patent Application 201180014310.3, dated Apr. 6, 2016, State Intellectual Property Office of China.

* cited by examiner

5μm

ELECTRICALLY CONDUCTIVE PASTE, AND ELECTRICALLY CONDUCIVE CONNECTION MEMBER PRODUCED USING THE PASTE

TECHNICAL FIELD

The present invention relates to an conductive paste used for bonding semiconductor devices, circuit boards or the like, and relates to an conductive connecting member such as a conductive bump, conductive die bonding portion obtained by heat-treating the conductive paste. The content of Japanese Patent Application No. 2010-061838 filed on Mar. 18, 2010 which is the basic application of the present application is incorporated in the present application as a reference document forming a part of the present specification.

BACKGROUND ART

Lately, a high density is promoted in a semiconductor mounting technology to realize high functionality, enhanced performance, and downsizing of electronic devices. A wire bonding (WB) technology, a tape automated wire bonding (TAB) technology relating to a wireless bonding technology, and a flip chip bonding (FCB) technology are listed as a representative technology of bonding method for bonding semiconductor devices, as well as a semiconductor device and a circuit board. As the technology to mount in high density semiconductor devices such as computer, the flip chip bonding (FCB) technology enabling the highest density mounting has been widely applied. The flip chip bonding bonds bumps (protruding part) formed on the semiconductor device or the like to the circuit board or the like. The bumps are formed mainly by means of plating process. According to the plating process for forming bumps, it is possible to form finely patterned bumps. In addition, the height of the bump is intended to be controlled under the various conditions. However, there is a problem in which the height of the bumps is varied to some extent. As the remedy for the variation of the height of the bumps so as to prevent the contact failure of the electrode, the pressure is applied at the bonding in order to closely contact all the bumps. The above described method is possible, however, the excessively applied pressure causes the strain to remain within the bump, and lowers the thermal stress resistance to result in the breakage. Accordingly, the structure of the bump for connecting to the metal fine pattern has preferably soft and flexible structure when the pressure is applied.

In addition, the bump formed by means of the plating has a problem in which cracks and fractures are caused supposedly due to the fatigue failure in the process of the usage. In the flip chip bonding (FCB) technology, in case that the material forming the semiconductor device is different from the material forming the circuit wiring board, the stress strain is caused on the solder bump electrode due to the difference of the expansion coefficients. The above described stress strain damages the solder bump electrode to lower a reliable life time. As the means to solve the above described problem, a porous body is known, which is formed by sintering the conductive paste containing metal fine particles.

Patent document 1 discloses, as the connecting bump for electrically connecting the conductive wiring circuit and the substrate, the bump comprising porous metal formed by sintering the metal fine particles having the mean particle diameter from 0.1 µm to 50 µm and the density thereof is from 0.2 to 0.9 times of that of the bulk type metal. Patent document 2 proposes the bump formed by a sintered porous body having elasticity and relatively soft. Since the bump has elasticity, even though the height of the bumps varies, the porous body is contracted by the applied pressure so as to enable the bonding. In addition, a lesser strain remains within the body, thus preventing to lower the heat resistant stress. Patent document 3 discloses a bonding process in which a porous metal layer comprising a third metal is interposed between the first metal layer and the second metal layer; a metal nano-paste, in which super fine metal particles having mean particle diameter up to 100 nm are dispersed in an organic solvent, is interposed between the first metal layer and the porous metal layer, between the second metal layer and the porous metal layer, respectively; and then the heating treatment is implemented to be bonded. Patent document 4 discloses bumps comprising a Au plating layer provided in a fine hole of a photo resist layer formed on a substrate (first bump layer, height of 10 µm) and a sintered body (a second bump layer) provided on the Au layer, in which Au paste as a metal paste is fallen as a drop and filled, and then sintered to form the sintered body. Patent document 5 discloses a method of manufacturing a ferrite porous body in which a sublimation substance is fully dissolved into an organic solvent, thus prepared dissolved liquid is blown from fine holes into water to precipitate fine particles of the sublimation substance, then thus obtained fine particles are mixed with a ferrite powder, then formed and baked.

PRIOR ART DOCUMENT

Patent Document

Patent document 1: Japanese Patent Application Publication No. 2003-174055
Patent document 2: Japanese Patent Application Publication No. 2005-216508
Patent document 3: Japanese Patent Application Publication No. 2006-202944
Patent document 4: Japanese Patent Application Publication No. 2009-302511

DISCLOSURE OF THE INVENTION

Problems to be Solved by the Invention

Since the metal porous body obtained by sintering the metal particles with micron size (namely, more than 1 µm, less than 1000 µm), disclosed in Patent document 1 has lower thermal stress resistance in comparison with nano (namely, less than 1 µm) sized metal porous body, there is a problem in which the thermal cycle characteristics is not relatively sufficient. More specifically, the porous body practically disclosed in Patent document 1 has the structure in which there exists micron sized pores between bonded micron sized metal particles.

According to the theory of propagation of crack in the metal material, there is known that the crack (consider as a hole) does not expand when the size of the crack is sufficiently small, even though a large stress is applied (refer to Japan Society of Materials Science edition, Fatigue design handbook, Jan. 20, 1995, published by Youkendo, pages 148 to 195). In this case, it is presumed, for example, that the bump having nano sized holes has stress resistance about 100 times of that of the bump having micron sized holes.

In case that the bump comprising the sintered body disclosed in Patent document 2 is used, there is no such problem as described above. However, since the bump has elasticity, the deformation in the lateral direction is likely caused at the mounting, thus resulting in the damage of the bump pitch.

When nano sized metal fine particles disclosed in Patent document 3 and Patent document 4 are sintered, solid powders remain up to around sintering temperature. Thus there is a problem in which the gas generated from the dispersion medium is entrapped to form coarse voids, and the bulge or crack is formed.

In case that the adhesiveness is poor at a die bonding portion which is the connecting structure portion between the semiconductor device and the interposer, the backside of the semiconductor device or the adhesive interface between the interposer connecting terminal and the conductive die bonding portion is partially peeled or completely peeled off due to a mechanical stress (outer stress, inner stress) or physical stress (thermal stress).

It is preferable that the conductive connecting member such as the conductive bump having excellent thermal cycle characteristics or the conductive die bonding portion is made of a porous body in which the conductive paste containing nano sized metal fine particles is sintered so that the surface of the fine particles is bonded and at the same time nano sized pores are formed. However, the mechanical strength or thermal cycle characteristics is remarkably deteriorated, when the metal fine particles are not uniformly located in the conductive paste, or the air bubbles are generated at the time that the organic dispersion agent is vaporized or thermally decomposed during the heating treatment, and grows to form the coarse void or crack within the porous body.

Means for Solving the Problem

In view of the above described prior art, the inventors have found the following and completed the invention. When the conductive metal fine particles having mean primary particle diameter from 1 to 150 nm are mixed at a specific ratio with the conductive metal (the same kind of metal as the above particles) fine particles having mean primary particle diameter from 1 to 10 μm, and a reducing organic solvent is used as an organic dispersion medium in the conductive paste, the conductive connecting member having excellent bonding strength such as the conductive bump, conductive die bonding portion or the like can be obtained, in which holes (voids) are uniformly located and the coarse void or crack does not exist. More specifically, the present invention is summarized as the following (1) to (17) inventions.

(1) An conductive paste including metal fine particles (P) comprising metal fine particles (P1) of one or more than two kinds selected from metal and alloy thereof, having mean primary particle diameter from 1 to 150 nm, and metal fine particles (P2) of same metal as the metal fine particles (P1), having mean primary particle diameter from 1 to 10 μm, mixing ratio of (P1/P2) being from 80 to 95 mass % for P1 and from 20 to 5 mass % for P2 (a total of mass % being 100 mass %); and an organic dispersion medium (D) comprising organic solvent (S), or organic solvent (S) and organic binder (B), mixing ratio (P/D) of the metal fine particles (P) and the organic dispersion medium (D) being from 50 to 85 mass % for P and from 50 to 15 mass % for D (a total of mass % being 100 mass %).

(2) The conductive paste described in the above (1), wherein the metal fine particles (P1) comprises one or more than two kinds selected from Cu, Au, Ag, Ni and Co.

(3) The conductive paste described in the above (1) or (2), wherein the mixing ratio (S/B) of the organic solvent (S) and the organic binder (B) in the organic dispersion medium (D) is from 80 to 100 mass % for S and from 20 to 0 mass % for B (a total of mass % being 100 mass %).

(4) The conductive paste described in any one of the above (1) to (3), wherein the organic dispersion medium (D) contains water, and the amount of the water is expressed in relation to mixing ratio (S/W) of the organic solvent (S) and the water (W) being from 75 to 99.9 mass % for S and from 25 to 0.1 mass % for W (a total of mass % being 100 mass %).

(5) The conductive paste described in any one of the above (1) to (4), wherein the organic solvent (S) comprises (i) an organic solvent (S1) comprising alcohol or polyalcohol having a boiling point of at least 100 degrees centigrade and one or more than two hydroxyl groups within molecule, or (ii) an organic solvent (S2) comprising 5 to 95 volume % of the organic solvent (S1) comprising alcohol or polyalcohol having a boiling point of at least 100 degrees centigrade and one or more than two hydroxyl groups within molecule, and 95 to 5 volume % of an organic solvent (SA) having amide group.

(6) The conductive paste described in the above (5), wherein the organic solvent (S1) comprises one or more than two kinds selected from the group consisting of ethylene glycol, diethylene glycol, 1,2-propanediol, 1,3-propanediol, 1,2-butandiol, 1,3-butanediol, 1,4-butanediol, 2-butene-1,4-diol, 2,3-butanediol, pentanediol, hexanediol, octanediol, glycerol, 1,1,1-tris hydroxymethyl ethane, 2-ethyl-2-hydroxymethyl-1,3-propanediol, 1,2,6-hexanetriol, 1,2,3-hexanetriol, 1,2,4-butanetriol, 1,2,6-hexanetriol, 1,2,3-hexanetriol, 1,2,4-butanetriol, threitol, erythritol, pentaerythritol, pentitol, hexitol, and iminodiethanol.

(7) The conductive paste described in the above (5), wherein the organic solvent (SA) comprises one or more than two kinds selected from the group consisting of N-methylacetamide, N-methylformamide, N-methylpropaneamide, formamide, N,N-dimethylacetamide, 1,3-dimethyl-2-imidazolidinone, N,N-dimethylformamide, 1-methyl-2-pyrolidone, hexamethylphosphoric triamide, 2-pyrrolidinone, ε-caprolactam, and acetamide.

(8) The conductive paste described in any one of the above (1) to (7), wherein the organic binder (B) comprises one or more than two kinds selected from the group consisting of cellulose resin binder, acetate resin binder, acrylic resin binder, urethane resin binder, polyvinilpyrroridone resin binder, polyamide resin binder, butyral resin binder, and terpene binder.

(9) The conductive paste described in the above (8), wherein the cellulose resin binder comprises one or more than two kinds selected from the group consisting of acetylcellulose, methyl cellulose, ethylcellulose, butylcellulose, and nitrocellulose; the acetate resin binder comprises one or more than two kinds selected from the group consisting of methyl glycol acetate, ethyl glycol acetate, butyl glycol acetate, ethyl diglycol acetate, and butyl diglycol acetate; the acrylic resin binder comprises one or more than two kinds selected from the group consisting of methyl methacrylate, ethyl methacrylate, and butylmethacrylate; the urethane resin binder comprises one or more than two kinds selected from the group consisting of 2,4-tolylenediisocyanate, and p-phenylene diisocyanate; the polyvinilpyrroridone resin binder comprises one or more than two kinds selected from the group consisting of polyvinil pyrolidone, and N-vinil pyrolidone; polyamide resin binder comprises one or more than two kinds selected from the group consisting of polyamide 6, polyamide 66, and polyamide 11; the butyral resin binder comprises polyvinil butyral; and the terpene binder comprises one or more than two kinds selected from the group consisting of pinene, cineol, limonene, and terpineol.

(10) The conductive paste described in any one of the above (1) to (9), wherein the organic solvent (S) and the organic binder (B) are vaporized or thermally decomposed, in case that the conductive paste is heat-treated to form a metal porous body.

(11) An conductive connecting member comprising a metal porous body formed in such manner that the conductive paste described in any one of the above (1) to (10) is mounted on one bonded surface of a semiconductor device in an electronic component, an electrode terminal of a circuit board, or a conductive substrate, and then, other bonded surface of other electrode terminal or other conductive substrate to be connected is placed on the conductive paste and heat-treated to be sintered, wherein in the metal porous body, particles according to the metal fine particles (P1) having mean particle diameter from 1 to 150 nm are caught between particles according to the metal fine particles (P2) having mean particle diameter from 1 to 10 μm and partially connected on a surface thereof, and holes are scattered between the metal fine particles (P1) and (P2).

(12) The conductive connecting member described in the above (11), wherein the electrically connecting member is a conductive bump to bond between the semiconductor devices.

(13) The conductive connecting member described in the above (11), wherein the electrically connecting member is a conductive die bonding portion to bond the semiconductor device and the conductive substrate.

(14) The conductive connecting member described in any one of the above (11) to (13), wherein the heating treatment is implemented under pressurized condition of 0.5 to 15 Mpa between the electrode terminals or between the electrode terminal and the substrate.

(15) The conductive connecting member comprising the metal porous body described in any one of the above (11) to (14), wherein a temperature in the heating treatment of the conductive paste is within a range from 150 to 350 degrees centigrade.

(16) The conductive connecting member comprising the metal porous body described in any one of the above (11) to (14), wherein a temperature in the heating treatment of the conductive paste is within a range from 250 to 300 degrees centigrade.

(17) The conductive connecting member comprising the metal porous body described in any one of the above (11) to (16), wherein porosity of the metal porous body is within a range from 5 to 35%.

Effect of the Invention (i) Since the first embodiment of the conductive paste described in the above (1) contains metal fine particles having two kinds of particle diameters, i.e., the metal fine particles (P1) having mean primary particle diameter from 1 to 150 nm and the metal fine particles (P2) having mean primary particle diameter from 1 to 10 μm, and the organic solvent (S), the metal fine particles (P2) limits the free movement of the nano sized metal fine particles (P1) within the paste to prevent the generation of the coarse void or crack due to the growth of the air bubble at the baking, when the conductive paste is heat-treated (sintered) to obtain the metal porous body, in comparison with the case that the paste has only nano sized metal fine particles, thus enabling to obtain the conductive connecting member in which the metal fine particles and the holes are dispersed. At the time of the heating treatment, the organic solvent (S) exists in the state of liquid and/or gas between the metal fine particles (P1) and the metal fine particles (P2), as well as between the metal fine particles (P1) to form a non-oxidizing atmosphere, thus preventing the oxidization of the metal fine particles to accelerate the sintering and the dispersed formation of the pores. As a result, in order to electrically and mechanically bond, when the conductive paste is baked on the bonding face of the electrode terminal to form the conductive connecting member, the bonding strength can be improved.

(ii) Since in the second embodiment of the conductive connecting member described in the above (11) the metal fine particles (P) and pores are uniformly dispersed and the coarse void and crack do not exist, the thermal cycle characteristics is improved so that both of the crack resistance and bonding strength are excellent.

EMBODIMENTS FOR CARRYING OUT THE INVENTION

The present invention is described in detail hereunder.

[1] Conductive Paste as the First Embodiment

The conductive paste as the first embodiment includes metal fine particles (P) comprising metal fine particles (P1) of one or more than two kinds selected from metal and alloy thereof, having mean primary particle diameter from 1 to 150 nm, and metal fine particles (P2) of the same metal as the metal fine particles (P1), having mean primary particle diameter from 1 to 10 μm, mixing ratio of (P1/P2) being from 80 to 95 mass % for P1 and from 20 to 5 mass % for P2 (a total of mass % being 100 mass %); and organic dispersion medium (D) comprising organic solvent (S), or organic solvent (S) and organic binder (B), mixing ratio of (P/D) of the metal fine particles (P) and the organic dispersion medium (D) being from 50 to 85 mass % for P and from 50 to 15 mass % for D (a total of mass % being 100 mass %).

(1) Metal Fine Particles (P)

The metal fine particles (P) comprise the metal fine particles (P1) having mean primary particle diameter from 1 to 150 nm, and the metal fine particles (P2) having mean primary particle diameter from 1 to 10 μm, and the mixing ratio of (P1/P2) is from 80 to 95 mass % for P1 and from 20 to 5 mass % for P2 (a total of mass % being 100 mass %). The metal fine particles (P1) and the metal fine particles (P2) as the components of the metal fine particles (P) are the same metal. Any metal can be used for the metal fine particles (P), as far as it can function as the conductive connecting member after the heating treatment when contained in the conductive paste. However, it is preferable that the metal fine particles (P) comprise one or more than two kinds selected from Cu, Au, Ag, Ni and Co, due to the conductivity, heating treatment (sintering), and availability in the market.

The mean primary particle diameter of the metal fine particles (P1) is from 1 to 150 nm. With the mean primary particle diameter being less than 1 nm, it is likely difficult to form the porous body having the homogeneous particle diameters and pores by sintering. On the other hand, with the mean particle diameter being over 150 nm, since the metal fine particles (P1) are located between the metal fine particles (P2) having mean primary particle diameter from 1 to 10 μm at the time that the conductive paste is heating-treated, the metal fine particles (P1) are not stably located between the metal fine particles (P2), thus lowering the function of the effect of the invention.

The mean particle diameter of the primary particles is defined in the present invention as the diameter of each primary particle forming secondary particles. The primary particle diameter can be measured based on the observation by the transmission-type electron microscope (TEM).

The mean particle diameter of the metal fine particles (P2) is from 1 to 10 μm. With the mean particle diameter of the metal fine particles (P2) being within the above range, the diameter difference from the metal fine particles (P1) is secured so as to effectively control the free movement of the metal fine particles (P1) at the time of the heating treatment. The mixing ratio of (P1/P2) of the metal fine particles (P1) and the metal fine particles (P2) in the metal fine particle s (P) is from 80 to 95 mass % for P1 and from 20 to 5 mass % for P2 (a total of mass % being 100 mass %). With the mixing ratio being within the above range, the metal fine particles (P2) are controlled so as not to disproportionately locate in the conductive connecting member which is the metal porous body prepared by heat-treating the conductive paste, thus enabling to improve dispersion.

(2) Organic Dispersion Medium (D)

The organic dispersion medium (D) comprises the organic solvent (S), or the organic solvent (S) and the organic binder (B). The organic dispersion medium (D) functions to disperse the metal fine particles (P1) and the metal fine particles (P2) in the conductive paste, to adjust the viscosity of the conductive paste, and to maintain the shape of the conductive connecting member precursor such as the bump precursor, die bonding precursor or the like, and in addition, functions as the reducing agent in the liquid and gas state at the heating treatment. It is preferable that the mixing ratio (S/B) of the organic solvent (S) and the organic binder (B) in the organic dispersion medium (D) is from 80 to 100 mass % for S and from 20 to 0 mass % for B (a total of mass % being 100 mass %). With the mixing ratio of the organic binder (B) in the organic dispersion medium (D) being over 20 mass %, the speed of the thermal decomposition and scattering of the organic binder (B) becomes slow at the time of the heat treating of the bump precursor. In addition, when the remaining amount of the carbon increases in the conductive bump, the sintering is disturbed to cause the problem such as cracking, peeling or the like, thus not favorable. If the metal fine particles (P1) and the metal fine particles (P2) can be dispersed, the viscosity of the conductive paste can be adjusted, and the shape of the conductive connecting member precursor such as the bump precursor, die bonding precursor or the like can be maintained by means of only the selected organic solvent (S) itself, the constituent of only the organic solvent (S) can be used as the organic dispersion medium (D).

(2-1) Organic Solvent (S)

It is preferable that the organic solvent (S) comprises (i) an organic solvent (S1) comprising alcohol or polyalcohol having a boiling point of at least 100 degrees centigrade and one or more than two hydroxyl groups within molecule, or (ii) an organic solvent (S2) comprising 5 to 95 volume % of the organic solvent (S1) comprising alcohol or polyalcohol having a boiling point of at least 100 degrees centigrade and one or more than two hydroxyl groups within molecule, and 95 to 5 volume % of an organic solvent (SA) having amide group.

It is conceived that when the reducing the organic solvent (S1) is contained in the organic dispersion medium (D), the surface of the metal fine particles is reduced, and thereafter, the binding based on the sintering proceeds at the time that the conductive paste is heat-treated. Thus, when the organic solvent (S1) is continuously vaporized, and reduced-baked in the atmosphere in which the liquid and vapor of the said solvent exist, the sintering is accelerated to form the conductive connecting member excellent in conductivity. Accordingly, when the organic solvent (S1) exists in the organic dispersion medium, non oxidization atmosphere is formed at the time of the heating treatment to accelerate the reduction and bonding on the surface of the metal fine particles (P). From this point of view, it is more preferable that the organic solvent (S2) comprises 60 to 95 volume % of the organic solvent (S1) and 40 to 5 volume % of the organic solvent (SA) having amide group.

The organic dispersion medium (D) may contains water, and the amount of the water is expressed in relation to mixing ratio (S/W) of the organic solvent Ss) and the water (W) being from 75 to 99.9 mass % for S and from 25 to 0.1 mass % for W (a total of mass % being 100 mass %). Since many of the organic solvent (S) described later have a good affinity with water, the water is easily absorbed. Accordingly, when the water is added in advance, it is possible to prevent the over time variation of the viscosity of the conductive paste. When the amide series organic solvent (SA) is contained in the organic solvent (S2) within the range of the above mixing ratio, the organic solvent (S1) is well mixed. In addition, when the organic solvent having a high boiling point is used as the organic solvent (S1), the organic solvent (SA) is accelerated to vaporize the solvent and to proceed the sintering between the particles, thus improvements of the adhesiveness between the sintered particles and the conductive substrate and the connecting strength after baking can be expected.

As the practical example of the organic solvent (S1), one kind or more than two kinds selected within the group consisting of the following can be exemplified: ethylene glycol (boiling point: 197 degree C.), diethylene glycol (boiling point: 244 degree C.), 1,2-propanediol (boiling point: 188 degree C.), 1,3-propanediol (boiling point: 212 degree C.), 1,2-butanediol (boiling point: 192 degree C.), 1,3-butanediol (boiling point: 208 degree C.), 1,4-butanediol (boiling point: 230 degree C.), 2-butene-1,4-diol (boiling point: 235 degree C.), 2,3-butanediol, pentanediol (boiling point: 239 degree C.), hexanediol (boiling point: 250 degree C.), octanediol (boiling point: 244 degree C.), glycerol (boiling point: 290 degree C.), 1,1,1-tris hydroxymethyl ethane, 2-ethyl-2-hydroxymethyl-1,3-propanediol (boiling point: 161 degree C.), 1,2,6-hexanetriol, 1,2,3-hexanetriol, 1,2,4-butanetriol, 1,2,6-hexanetriol, 1,2,3-hexanetriol, and 1,2,4-butanetriol.

In addition, as the organic solvent (S1), the following sugar group can be used: threitol, erythritol (boiling point: 331 degree C.), pentaerythritol, pentitol, xylitol (boiling point: 216 degree C.), ribitol, arabitol, hexitol, mannitol, sorbitol, dulcitol, glycerin aldehyde, dioxiacetone, threose, erythrulose, erythrose, arabinose, ribose, ribulose, xylose, xylulose, lyxose, glucose, fuructose, mannose, idose, sorbose, gluse, talose, tagatose, galactose, allose, altrose, lactose, xylose, arabinose, isomaltose, glucoheptose, heptose, maltotriose, lactulose, and trehalose. Among the above, those having a high boiling point can be used with the other organic solvent (S1) being mixed. The boiling point is expressed as the boiling point under a normal pressure in the above example in the polyalcohol.

As the organic solvent (S1), a poly alcohol having more than two hydroxyl groups, and the carbon group bonded with the hydroxyl group having (—CH(OH)—) structure is further preferable because of more effective reducing function. The boiling point is expressed as the boiling point under a normal pressure in the above example in the polyalcohol.

As the practical example of the organic solvent (SA), the following can be exemplified: N-methylacetamide, N-methylformamide, N-methylpropaneamide, formamide, N,N-dimethylacetamide, 1,3-dimethyl-2-imidazolidinone, N,N-dimethylformamide, 1-methyl-2-pyrolidone, hexamethylphosphoric triamide, 2-pyrrolidinone, ε-caprolactam, acetamide, and the like.

(2-2) Organic Binder (B)

The organic binder (B) functions to prevent the agglomeration of the metal fine particles (P) in the conductive paste, to adjust the viscosity of the conductive paste, and to maintain the shape of the conductive connecting member precursor such as the conductive bump precursor, conductive die bonding precursor or the like.

As the organic binder (B) having the above functions, one kind or more than two kinds selected within the group consisting of the following is preferable: cellulose resin binder, acetate resin binder, acrylic resin binder, urethane resin binder, polyvinilpyrroridone resin binder, polyamide resin binder, butyral resin binder, and terpene binder.

As the practical example of the organic binder (B), there are exemplified the following: as the cellulose resin binder: acetylcellulose, methyl cellulose, ethylcellulose, butylcellulose, and nitrocellulose; as the acetate resin binder: methyl glycol acetate, ethyl glycol acetate, butyl glycol acetate, ethyl diglycol acetate, and butyl diglycol acetate; as the acrylic resin binder: methyl methacrylate, ethyl methacrylate, and butylmethacrylate; as the urethane resin binder: 2,4-tolylenediisocyanate, and p-phenylene diisocyanate; as the polyvinilpyrroridone resin binder: polyvinil pyrolidone, and N-vinil pyrolidone; as the polyamide resin binder: polyamide 6, polyamide 66, and polyamide 11; as the butyral resin binder: polyvinil butyral; and as the terpene binder: pinene, cineol, limonene, and terpineol.

(3) Conductive Paste

The conductive paste contains the metal fine particles (P) and the organic dispersion medium (D), and is a paste state in which the metal fine particles (P) are uniformly dispersed in the organic dispersion medium (D). The metal fine particles (P) and the organic dispersion medium (D) are contained with the mixing ratio from 50 to 85 mass % for P and from 50 to 15 mass % for D (a total of mass % being 100 mass %). With the mixing ratio of the metal fine particles (P) being over 85 mass %, the paste becomes high in viscosity, causing insufficient bonding between the surfaces of the metal fine particles so as to lower the conductivity. On the other hand, with the mixing ratio of the metal fine particles (P) being less than 50 mass %, the paste becomes low in viscosity, so that it becomes difficult to maintain the shape of the conductive connecting member precursor applied on the bonding face of the electrode terminal of the semiconductor device or the electrode terminal of the circuit board, causing problem in which the metal porous body is shrunk during the heating treatment. From the above described point of view, the mixing ratio (P/D) of the metal fine particles (P) and the organic dispersion medium (D) is favorably from 55 to 80 mass % for P and from 45 to 20 mass % for D (a total of mass % being 100 mass %).

In the present invention, such principle is utilized that when the conductive paste is heating-treated, the vaporization of the organic solvent (S), or the vaporization of the organic solvent (S) and at the same time the thermal decomposition of the organic binder (B) proceeds at a certain temperature, to bond (sinter) the surfaces of the metal fine particles (P) after contacting each other. An Antifoam agent, dispersing agent, plasticizing agent, surface-active agent, granulating agent, or the like, or other metal particles can be added to the conductive paste of the invention, within the range as far as the effect of the invention is not deteriorated. When the conductive paste is manufactured, the organic dispersion medium (D) is added to the metal fine particles (P) so that the shearing stress is added, thus enabling to prepare the conductive paste with the process of kneading. For example, a kneader, a kneading equipment such as three rolls or the like, or Raikai mixer which can knead in the sealed system can be used to add the shearing stress. It is preferable at the kneading that the copper powder is not exceedingly oxidized.

[2] Conductive Connecting Member as the Second Embodiment

The conductive connecting member as the second embodiment comprises a metal porous body formed in such manner that the conductive paste described in the first embodiment is mounted on one bonded surface of a semiconductor device in an electronic component, an electrode terminal of a circuit board, or a conductive substrate, and then, other bonded surface of other electrode terminal or other conductive substrate to be connected is placed on the conductive paste and heat-treated so as to be sintered, wherein in the metal porous body, a particle according to the metal fine particles (P1) having mean particle diameter from 1 to 150 nm is caught between particles according to the metal fine particles (P2) having mean particle diameter from 1 to 10 μm and partially connected on a surface thereof, and pores are scattered between the metal fine particles (P1) and (P2).

(1) Manufacturing for the Conductive Connecting Member

As the conductive connecting member, there are listed the conductive bump to bond the semiconductor devices, and the conductive die bonding portion to bond the semiconductor device and the conductive substrate, or the like, however, the conductive connecting member is not limited to the above.

The conductive connecting member is formed in such manner that the conductive paste is mounted on one bonded surface of a semiconductor device in an electronic component, or an electrode terminal of a circuit board (application, printing or the like are included), and then, other bonded surface of other electrode terminal or other conductive substrate to be connected is placed on the conductive paste and heating-treated or heating-treated under pressure to be sintered. The wire such as Au wire for wire bonding is included on the other electrode terminal to be bonded. When the bonded surface of the other electrode to be connected is mounted on the conductive paste, it is preferable to implement the alignment.

The conductive die bonding portion is in general formed in such manner that the conductive paste is mounted on one bonded surface of a circuit board in an electronic component (application, printing or the like are included), and then, other bonded surface of other electrode terminal to be connected is placed on the conductive paste and heating-treated or heating-treated under pressure to be sintered.

In the heating treatment under pressure, the pressure is applied between both of the electrode terminals, or between the electrode and the substrate, in order to secure the bonding between the conductive connecting member precursor and both of the electrode terminals, or the electrode terminal and the conductive substrate, or in order to deform the conductive connecting member precursor, thus enabling to sure-bond with the bonding face of the electrode terminal, in addition, in order to enlarge the bonding area between the conductive connecting member precursor and the bonding face of the electrode terminal, thus further improving the bonding reliability. Furthermore, when the semiconductor device and the conductive connecting member precursor are baked under pressure with the use of the pressure type heat tool or the like, the sintering in the bonding portion is improved so as to obtain further excellent bonding portion.

The pressure applied between the both of the electrode terminals or between the electrode terminal and the substrate is preferably from 0.5 to 15 Mpa. With the applied pressure being more than 0.5 Mpa, the effect to prevent the formation of a large void on the bonding face is improved. On the other hand, with the applied pressure being over 15 Mpa, the gap between the conductive the metal fine particles (P1) is reduced to likely lower the rate of the gap.

The conductive paste described in the first embodiment can be used. More specifically, the conductive paste can be used which includes the metal fine particles (P) which comprises the metal fine particles (P1) of one or more than two kinds selected from metal and alloy thereof, having mean primary particle diameter from 1 to 150 nm, and the metal fine particles (P2) of the same metal as the metal fine particles (P1), having mean primary particle diameter from 1 to 10 μm, the mixing ratio of (P1/P2) being from 80 to 95 mass % for P1 and from 20 to 5 mass % for P2 (a total of mass % being 100 mass %); and an organic dispersion medium (D) comprising the organic solvent (S), or the organic solvent (S) and the organic binder (B), mixing ratio (P/D) of the metal fine particles (P) and the organic dispersion medium (D) being from 50 to 85 mass % for P and from 50 to 15 mass % for D (a total of mass % being 100 mass %). The constituent of the metal fine particles (P1), the metal fine particles (P2), the organic solvent (S) and the organic binder (B) are as described in the first embodiment. As described in the first embodiment, it is preferable that the organic dispersion medium (D) comprises the organic solvent (S) 80 to 100 mass %, and the organic binder (B) 20 to 0 mass %.

As the method for manufacturing the conductive connecting member precursor such as the conductive bump precursor, and the conductive die bonding portion precursor by mounting the conductive paste on the electrode terminal or the like of the semiconductor, there is listed for example, a method of applying the conductive paste by the known screen printing, a resist (pattern) described later or the like in which the opening portion is formed on the connecting portion of the electrode terminal, and the conductive paste is applied on the opening portion. In case that the screen printing is used, a prescribed screen pattern with the resist is placed on the electrode terminal or the like of the semiconductor, then the conductive paste is placed thereon, and the conductive paste is slid by the squeegee. The conductive paste passes the screen through the portion with no resist so as to be transferred onto the electrode terminal or the like, thus the conductive connecting member precursor such as the conductive bump precursor, the conductive die bonding portion precursor or the like is formed.

The following is used as the method for forming the opening portion to fill the conductive paste: a photolithography method in which a pattern is formed on the photopolymer layer following the lithographic exposure and development processes, or a method in which a high energy beam such as a laser beam, electron beam, ion beam or the like is irradiated on the insulating resin layer provided on the device to form the opening portion on the insulating resin layer by means of the heating to melt or the ablation in which the molecular bond in the resin is cut off. Among the above, the photolithography method, or the method for forming the opening portion by the ablation with the use of laser beam is preferable from the practical use point of view. The alignment is carried out by the use of optical device between the electrode terminal on the semiconductor device and the electrode terminal of the circuit board for securing the electrical connection therebetween after heating treatment (sintering), for example, the alignment between the electrode terminal on the semiconductor device and the connecting electrode terminal of the conductive substrate forwarded by a tape reel or the like.

The conductive connecting member precursor such as the bump precursor, the die bonding portion precursor formed on the electrode terminal of the semiconductor, contacting with the corresponding electrode terminal, is preferably heat-treated (sintered) at a temperature from 150 to 350 degrees C., more preferably from 250 to 300 degrees C. to form the conductive connecting member, thus the electrode terminal or the like of the semiconductor device and the corresponding electrode terminal or the like is electrically and mechanically bonded through the conductive connecting member. The time required for the heating treatment is preferably from 5 to 30 minutes, depending on the kind of the metal fine particles (P1), and the organic dispersion medium (D) to be used. Since the fine particles having mean primary particle diameter from 1 to 150 nm is used as the metal fine particles (P1), after removing the organic dispersion medium (D) by heating, the bonding (sintering) proceeds between the surfaces of the metal fine particles by means of the energy on the surface at a lower temperature than the melting point of the bulk state metal. Thus, the conductive connecting member of the metal porous body such as the conductive bump, the conductive die bonding or the like is formed.

(2) Conductive Connecting Member

The conductive connecting member as the second embodiment, as previously described, comprises a metal porous body formed in such manner that the conductive paste described in the first embodiment is mounted on an electrode terminal of a semiconductor device in an electronic component or a circuit board, or a bonded surface of a conductive substrate, and then, other bonded surface of other electrode terminal or other conductive substrate to be connected is placed on the conductive paste and heat-treated to be sintered, wherein in the metal porous body, particles according to the metal fine particles (P1) having mean particle diameter from 1 to 150 nm are caught between particles according to the metal fine particles (P2) having mean particle diameter from 1 to 10 μm and partially connected on a surface thereof, and pores are scattered between the metal fine particles (P1) and (P2).

In the conductive connecting member obtained by the heating treatment, the metal fine particles (P1) contact each other on the surfaces under the condition that the deformation and the stress to the meal fine particles (P1) is eased in comparison with conductive bump and the like formed by means of the plating process, so that the conductive connecting member has appropriate elasticity and softness as well as excellent electrical conductivity. Thus obtained conductive connecting member of the sintered porous body such as the conductive bump, conductive die bonding portion or the like has a porosity from 5 to 35 volume %, and the pores exist proportionately, thus having excellent mechanical and electrical bonding, improved thermal cycle characteristics, and excellent crack resistance. The porosity of the conductive bump shaped matter or the conductive die bonding portion is calculated in such manner that the conductive bump shaped matter or the conductive die bonding portion is photographed with the use of the scanning type electron microscope to produce an electron microscope picture with 1000 to 10000 times magnification for observation, and the cross sectional image is analyzed.

EXAMPLES

The present invention is practically described with reference to the examples, however the invention is not limited to those examples. In the examples 1 to 3 and the comparative examples 1 to 5, the samples of the conductive bumps for evaluation were prepared, and in the examples 4 to 6 and the comparative examples 6 to 10, the samples of the conductive die bonding portion for evaluation were prepared to implement the evaluation. The process of preparation of the samples for evaluation in the examples and comparative examples are descried below. The evaluation methods of the conductive bump and the conductive die bonding portion are described later.

Example 1

Ag fine particles having mean primary particle diameter of 60 nm and Ag fine particles having mean primary particle diameter of 5 μm were mixed with mixing ratio of 95:5 (mass %), and ethylene glycol as the organic solvent having reducibility was added to the above mixed matter so that Ag fine particle concentration became 60 mass %, and then sufficiently stirred to prepare the conductive paste. The conductive paste was applied by the screen printing on the conductive substrate (Direct Bonding Copper (DBC) substrate) to form four conductive bump precursors (size: 50 μm Φ, thickness: 150 nm), each of the conductive bump precursors located at the corner of the quadrate. A Si chip (shape: rectangular solid, each side being 4.5 mm) with the Au spattered studs (size: 50 μm Φ, thickness: 150 nm) was mounted in such manner that each of the Au spattered face of the studs was facing to the corresponding the above conductive bump precursor. The conductive substrate with the Si chip mounted was heating-treated at the temperature of 200 degrees C. to sinter the Ag fine particles contained in the conductive paste, thus preparing the conductive bump in which the conductive substrate and the terminal of the Si chip were electrically and mechanically bonded. Thus prepared bumps were evaluated by means of the bonding strength test (mean value of the measurement (N=10) or the like described later. The result of the evaluation is shown in Table 1.

Example 2

Figure 1:
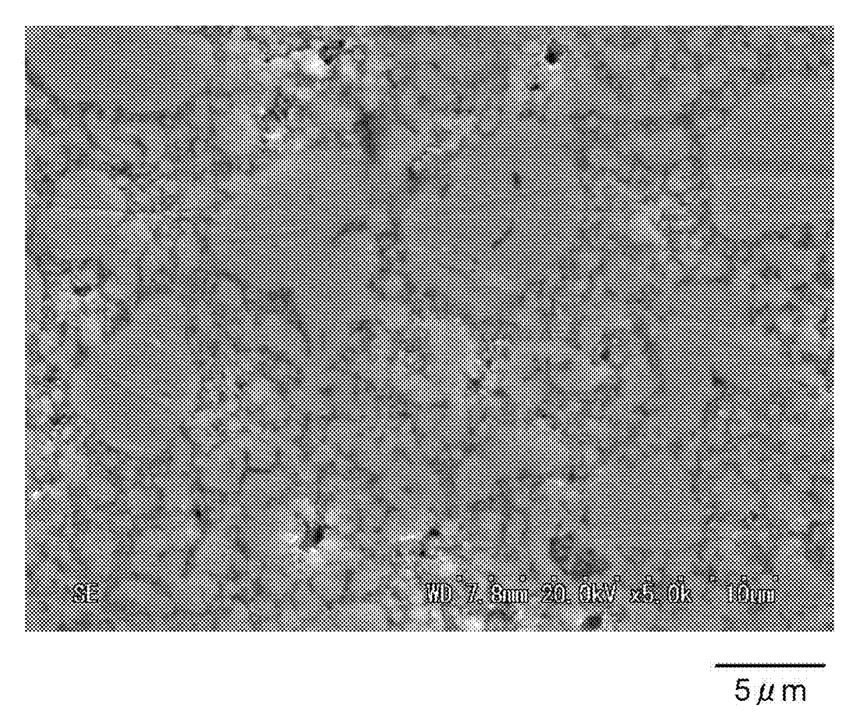
FIG. 1 is a cross sectional view in the electron microscope photograph of the conductive bump obtained in Example 2.

The Cu fine particles having mean primary particle diameter of 120 nm prepared by the electroless reduction of the Cu ion in the aqueous solution, and the Cu fine particles having mean primary particle diameter of 7 μm prepared by the same electroless reduction were mixed with mixing ratio of 90:10 (mass %), and glycerol as the organic solvent having reducibility was added to the above mixed matter so that Cu fine particle concentration became 80 mass % to prepare the conductive paste, in the same manner as in Example 1. The conductive bump in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 1 was implemented for the obtained conductive bump. The result of the evaluation is shown in Table 1. The electron microscope picture of the cross section of the conductive bump obtained in Example 2 is shown in FIG. 1. It was observed from FIG. 1 that the sintered particles due to Cu fine particles having mean primary particle diameter of 7 μm were dispersed in the conductive bump, while the sintered particles due to Cu fine particles having mean primary particle diameter of 120 nm existed around the above described sintered particles without a coarse void or crack.

Example 3

The same Cu fine particles having mean primary particle diameter of 120 nm and the same Cu fine particles having mean primary particle diameter of 7 μm as used in Example 2 were mixed with mixing ratio of 90:10 (mass %), and the mixed organic solvent comprising glycerol 80 volume % and N-methylacetamide 20 volume % as the organic solvent was added to the above mixed matter so that Cu fine particle concentration became 75 mass % to prepare the conductive paste. The conductive bump in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 1 was implemented for the obtained conductive bump. The result of the evaluation is shown in Table 1.

Comparative Example 1

Glycerol as the reducible organic solvent was added to the same Cu fine particles having mean primary particle diameter of 120 nm as used in Example 2, and adjusted so that the concentration of the Cu fine particles became 50 mass % to prepare the conductive paste. The conductive bump in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 1 was implemented for the obtained conductive bump. The result of the evaluation is shown in Table 1.

Comparative Example 2

The same Cu fine particles having mean primary particle diameter of 120 nm as used in Example 2 and Cu fine particles having mean primary particle diameter of 10 μm prepared by the electroless reduction of the Cu ion in the aqueous solution were mixed with mixing ratio of 75:25 (mass %), then glycerol as the reducible organic solvent was added to the above mixed matter, and adjusted so that the concentration of the Cu fine particles became 50 mass % to prepare the conductive paste. The conductive bump in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 1 was implemented for the obtained conductive bump. The result of the evaluation is shown in Table 1.

Comparative Example 3

The same Cu fine particles having mean primary particle diameter of 120 nm as used in Example 2 and Cu fine particles having mean primary particle diameter of 10 μm prepared by the electroless reduction of the Cu ion in the aqueous solution were mixed with mixing ratio of 70:30 (mass %), then glycerol as the reducible organic solvent was added to the above mixed matter, and adjusted so that the concentration of the Cu fine particles became 50 mass % to prepare the conductive paste. The conductive bump in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 1 was implemented for the obtained conductive bump. The result of the evaluation is shown in Table 1.

Comparative example 4

The same Cu fine particles having mean primary particle diameter of 120 nm as used in Example 2 and Cu fine particles having mean primary particle diameter of 15 μm prepared by the electroless reduction of the Cu ion in the aqueous solution were mixed with mixing ratio of 95:5 (mass %), then glycerol as the reducible organic solvent was added to the above mixed matter, and adjusted so that the concentration of the Cu fine particles became 50 mass % to prepare the conductive paste. The conductive bump in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 1 was implemented for the obtained conductive bump. The result of the evaluation is shown in Table 1.

Comparative example 5

The same Cu fine particles having mean primary particle diameter of 120 nm as used in Example 2 and Cu fine particles having mean primary particle diameter of 6 μm prepared by the electroless reduction of the Cu ion in the aqueous solution were mixed with mixing ratio of 95:5 (mass %), then glycerol as the reducible organic solvent was added to the above mixed matter, and adjusted so that the concentration of the Cu fine particles became 90 mass % to prepare the conductive paste. The conductive bump in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 1 was implemented for the obtained conductive bump. The result of the evaluation is shown in Table 1.

Evaluation standards in Table 1 for the above examples 1 to 3 and the comparative examples 1 to 5 were as follows:

(i) Volume Porosity
A for 5 to 35 volume % porosity in the conductive bump; B for over 35 volume %; C for less than 5 volume %.

(ii) Mean Bonding Strength Test
It was calculated as follows: a Si chip connecting sample for the bonding strength test in which the substrate and the Si chip was bonded with the conductive bump was prepared, then the Si chip was peeled off from the substrate by the die share testing device to calculate the required power, and the required power was divided by the bonded area of the conductive bump to calculate the bonding strength per unit area ($N/mm^2$).

(iii) With or without Coarse Void
A: coarse void more than 10 μm was not observed in the conductive bump; B: coarse void more than 10 μm was observed.

(iv) With or without Crack
A: crack is not observed in the conductive bump or the bonded surface thereof; B: crack is observed.

TABLE 1

| | Volume pore ratio | Mean bonding strength [$N/mm^2$] | With or without coarse void | With or without crack |
|---|---|---|---|---|
| Example 1 | A | 32.4 | A | A |
| Example 2 | A | 35.1 | A | A |
| Example 3 | A | 40.3 | A | A |
| Comparative example 1 | B | 27.7 | B | A |
| Comparative example 2 | A | 9.8 | B | B |
| Comparative example 3 | B | 15.6 | B | A |
| Comparative example 4 | B | 17.2 | B | B |
| Comparative example 5 | C | 6.5 | A | B |

Example 4

Ag fine particles having mean primary particle diameter of 60 nm and Ag fine particles having mean primary particle diameter of 5 μm were mixed with mixing ratio of 95:5 (mass %), and ethylene glycol as the organic solvent having reducibility was added to the above mixed matter so that Ag fine particle concentration became 60 mass %, and then sufficiently stirred to prepare the conductive paste. A tape (vinyl chloride tape) with the thickness of 150 μm was put on the conductive substrate (Direct Bonding Copper (DBC) substrate), then the conductive paste (shape: rectangular solid, each side being 4 mm) was applied thereon, and the Si chip (shape: rectangular solid, each side being 3.5 mm) with the Au spattered studs was mounted in such manner that each of the Au spattered face of the studs was facing to the corresponding the above conductive paste.

Then, the conductive substrate, the conductive paste and Si chip portion were heating-treated at the temperature of 200 degrees C., under the pressure of 2 Mpa applied in the conductive paste to the conductive substrate with Si chip mounted, so as to sinter the metal fine particles contained in the conductive paste, thus preparing the Si chip connecting sample in which the conductive substrate and the Si chip were electrically and mechanically bonded. Thus prepared conductive die bonding portions were evaluated by means of the bonding strength test (mean value of the measurement (N=10) or the like. The result of the evaluation is shown in Table 2.

Example 5

The same Cu fine particles having mean primary particle diameter of 120 nm and the same Cu fine particles having mean primary particle diameter of 7 μm prepared by the electroless reduction of the Cu ion in the aqueous solution as used in Example 2 were mixed with mixing ratio of 90:10 (mass %), then glycerol 80 volume % as the organic solvent was added to the above mixed matter so that Cu fine particle concentration became 80 mass %, and then sufficiently stirred to prepare the conductive paste. The conductive die bonding portion in which the conductive substrate and the terminal of the Si chip were electrically and mechanically bonded was prepared in the same manner as in Example 4, except that the conductive paste obtained above was used, and the temperature of the heating treatment was 300 degrees C. The same evaluation as in Example 4 was implemented for the obtained conductive die bonding portion. The result of the evaluation is shown in Table 2.

Example 6

The same Cu fine particles having mean primary particle diameter of 120 nm and the Cu fine particles having mean primary particle diameter of 7 μm as used in Example 5 were mixed with mixing ratio of 90:10 (mass %), then the mixed organic solvent comprising glycerol 80 volume % and N-methylacetamide 20 volume % as the organic solvent as the organic solvent having reducibility was added to the above mixed matter so that Cu fine particle concentration became 75 mass %, and then sufficiently stirred to prepare the conductive paste. The conductive die bonding portion in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 4 was implemented for the obtained conductive bump. The result of the evaluation is shown in Table 2.

Comparative example 6

Glycerol as the organic solvent was added to the same Cu fine particles having mean primary particle diameter of 120 nm as used in Example 5 so that Cu fine particle concentration became 50 mass %, and then sufficiently stirred to prepare the conductive paste. The conductive die bonding portion in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 4 was implemented for the obtained conductive die bonding portion. The result of the evaluation is shown in Table 2.

Comparative Example 6

The same Cu fine particles having mean primary particle diameter of 120 nm and the same Cu fine particles having mean primary particle diameter of 10 μm prepared by the electroless reduction of the Cu ion in the aqueous solution as used in Example 5 were mixed with mixing ratio of 75:25 (mass %), then glycerol as the organic solvent was added to the above mixed matter so that Cu fine particle concentration became 50 mass %, and then sufficiently stirred to prepare the conductive paste. The conductive die bonding portion in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 4 was implemented for the obtained conductive die bonding portion. The result of the evaluation is shown in Table 2.

Comparative Example 8

The same Cu fine particles having mean primary particle diameter of 120 nm and the same Cu fine particles having mean primary particle diameter of 10 μm prepared by the electroless reduction of the Cu ion in the aqueous solution as used in Example 5 were mixed with mixing ratio of 70:30 (mass %), then glycerol as the organic solvent was added to the above mixed matter so that Cu fine particle concentration became 50 mass %, and then sufficiently stirred to prepare the conductive paste. The conductive die bonding portion in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 4 was implemented for the obtained conductive die bonding portion. The result of the evaluation is shown in Table 2.

Comparative Example 9

The same Cu fine particles having mean primary particle diameter of 120 nm and the same Cu fine particles having mean primary particle diameter of 15 μm prepared by the electroless reduction of the Cu ion in the aqueous solution as used in Example 5 were mixed with mixing ratio of 95:5 (mass %), then glycerol as the organic solvent was added to the above mixed matter so that Cu fine particle concentration became 50 mass %, and then sufficiently stirred to prepare the conductive paste. The conductive die bonding portion in which the conductive substrate and the terminal of the Si chip were electrically and mechanically bonded was prepared in the same manner as in Example 1, except that the conductive paste obtained above was used, and the temperature of the heating treatment was 300 degrees C. The bonding strength test was implemented for the obtained conductive die bonding portion. The same evaluation as in Example 4 was implemented for the obtained conductive die bonding portion. The result of the evaluation is shown in Table 2.

Comparative Example 10

The same Cu fine particles having mean primary particle diameter of 250 nm and the same Cu fine particles having mean primary particle diameter of 6 μm prepared by the electroless reduction of the Cu ion in the aqueous solution as used in Example 5 were mixed with mixing ratio of 95:5 (mass %), then glycerol as the organic solvent was added to the above mixed matter so that Cu fine particle concentration became 50 mass %, and then sufficiently stirred to prepare the conductive paste. The conductive die bonding portion in which the conductive substrate and the terminal of the Si chip were electrically and mechanically bonded was prepared in the same manner as in Example 1, except that the conductive paste obtained above was used, and the temperature of the heating treatment was 300 degrees C. The same evaluation as in Example 4 was implemented for the obtained conductive die bonding portion. The result of the evaluation is shown in Table 2.

Evaluation standards in Table 2 were as follows:
(i) Volume Porosity
The porosity of the conductive bump was calculated in such manner that the conductive bump was photographed with the use of the scanning type electron microscope (SEM) to produce an electron microscope picture with 1000 to 10000 times magnification for observation, and the cross sectional image thereof was analyzed.
A for 3 to 25 volume % porosity in the conductive die bonding portion; B for over 25 volume % and less than 35 volume %; C for over 35 volume %; D for less than 3 volume %.
(ii) Mean Bonding Strength Test
It was calculated as follows: a Si chip connecting sample for the bonding strength test in which the substrate and the Si chip was bonded with the conductive die bonding portion was prepared, then the Si chip was peeled off from the substrate by the die share testing device to calculate the required power, and the required power was divided by the bonded area of the conductive die bonding portion to calculate the bonding strength per unit area (N/mm$^2$).
(iii) With or without Coarse Void
A: coarse void more than 5 μm is not observed in the conductive die bonding portion; B: coarse void more than 5 μm is observed.
(iv) With or without Crack
A: crack is not observed in the conductive die bonding or the bonded surface thereof; B: crack is observed.

TABLE 2

| | Volume pore ratio | Mean bonding strength [N/mm$^2$] | With or without coarse void | With or without crack |
|---|---|---|---|---|
| Example 4 | A | 38.4 | A | A |
| Example 5 | A | 45.2 | A | A |
| Example 6 | A | 49.7 | A | A |
| Comparative example 6 | B | 28.4 | B | A |
| Comparative example 7 | A | 15.9 | B | B |
| Comparative example 8 | B | 23.4 | B | A |
| Comparative example 9 | B | 25.9 | B | B |
| Comparative example 10 | D | 7.2 | A | B |

What is claimed is:

1. A conductive paste comprising:
   metal fine particles (P) including metal fine particles (P1) and metal fine particles (P2), said metal fine particles (P1) being of one or more kinds selected from metals and/or alloys thereof, said metal fine particles (P1) having a mean primary particle diameter of 1 to 150 nm, said metal fine particles (P2) being of the same metals and/or alloys as those of the metal fine particles (P1), said metal fine particles (P2) having a mean primary particle diameter of 1 to 10 μm; and
   an organic dispersion medium (D) formed of an organic solvent (S) or a mixture of the organic solvent (S) and an organic binder (B),
   wherein said metal fine particles (P1) have a mass % of 80 to 95% relative to the total mass of the metal fine particles (P1) and the metal fine particles (P2),
   said metal fine particles (P1) are formed of Cu,
   said metal fine particles (P2) have a mass % of 5 to 20% relative to the total mass of the metal fine particles (P1) and the metal fine particles (P2),
   said organic solvent (S) includes an organic solvent (S1) that is capable of reducing a surface of the metal fine particles (P1),
   said organic solvent (S1) is formed of an alcohol or a polyalcohol having a boiling point of at least 100 degrees centigrade,
   said organic solvent (S1) has one or more hydroxyl groups within a molecule thereof and a carbon group bonded with the hydroxyl group having a (—CH(OH)—) structure, and
   said organic dispersion medium (D) has a mass % of 15 to 50% relative to a total mass of the metal fine particles (P) and the organic dispersion medium (D).

2. The conductive paste according to claim 1, wherein said organic dispersion medium (D) is formed of the organic solvent (S) having a mass % of 80 to 100% and the organic binder (B) having a mass % of 0 to 20% relative to a total mass of the organic solvent (S) and the organic binder (B).

3. The conductive paste according to claim 1, wherein said organic dispersion medium (D) further contains water (W), and
   said water (W) has a mass % of 0.1 to 25% relative to a total mass of the organic solvent (S) and the water (W).

4. The conductive paste according to claim 1, wherein said organic solvent (S) includes a mixture of the organic solvent (S1) and an organic solvent (SA) having an amide group and a volume % of 5 to 95% relative to a total volume of the organic solvent (S1) and the organic solvent (SA).

5. The conductive paste according to claim 4, wherein said organic solvent (S1) is formed of at least one selected from the group consisting of ethylene glycol, diethylene glycol, 1,2-propanediol, 1,3-propanediol, 1,2-butandiol, 1,3-butanediol, 1,4-butanediol, 2-butene-1, 4-diol, 2,3-butanediol, pentanediol, hexanediol, octanediol, glycerol, 1,1,1-tris hydroxymethyl ethane, 2-ethyl-2-hydroxymethyl-1,3-propanediol, 1,2,6-hexanetriol, 1,2,3-hexanetriol, 1,2,4-butanetriol, 1,2,6-hexanetriol, 1,2,3-hexanetriol, 1,2,4-butanetriol, threitol, erythritol, pentaerythritol, pentitol, hexitol and iminodiethanol.

6. The conductive paste according to claim 4, wherein said organic solvent (SA) is formed of at least one selected from the group consisting of N-methylacetamide, N-methylformamide, N-methylpropaneamide, formamide, N,N-dimethylacetamide, 1,3-dimethyl-2-imidazolidinone, N,N-dimethylformamide, 1-methyl-2-pyrolidone, hexamethylphosphoric triamide, 2-pyrrolidinone, ε-caprolactam, and acetamide.

7. The conductive paste according to claim 1, wherein said organic binder (B) is formed of at least one selected from the group consisting of a cellulose resin binder, an acetate resin binder, an acrylic resin binder, a urethane resin binder, a polyvinilpyrroridone resin binder, a polyamide resin binder, a butyral resin binder, and a terpene binder.

8. The conductive paste according to claim 7, wherein said cellulose resin binder is formed of at least one selected from the group consisting of acetylcellulose, methyl cellulose, ethylcellulose, butylcellulose, and nitrocellulose,
   said acetate resin binder is formed of at least one selected from the group consisting of methyl glycol acetate, ethyl glycol acetate, butyl glycol acetate, ethyl diglycol acetate, and butyl diglycol acetate, said acrylic resin binder is formed of at least one selected from the group consisting of methyl methacrylate, ethyl methacrylate, and butylmethacrylate, said urethane resin binder is formed of at least one selected from the group consisting of 2,4-tolylenediisocyanate and p-phenylene diisocyanate, said polyvinilpyrroridone resin binder is formed of at least one selected from the group consisting of polyvinil pyrolidone and N-vinil pyrolidone, said polyamide resin binder is formed of at least one selected from the group consisting of polyamide 6, polyamide 66, and polyamide 11, said butyral resin binder is formed of polyvinil butyral, and said terpene binder is formed of at least one selected from the group consisting of pinene, cineol, limonene, and terpineol.

9. The conductive paste according to claim 1, wherein said organic solvent (S) and said organic binder (B) are vaporized or thermally decomposed when the conductive paste is heat-treated to form a metal porous body.

10. An conductive connecting member comprising:
a metal porous body formed of the conductive paste according to claim 1,
wherein said conductive paste is mounted on one bonded surface of a semiconductor device in an electronic component, an electrode terminal of a circuit board, or a conductive substrate before other bonded surface of other electrode terminal or other conductive substrate to be connected is placed on the conductive paste, and heat-treated to be sintered,
said metal porous body includes the metal fine particles (P1) situated between the metal fine particles (P2) and pores scattered between the metal fine particles (P1) and (P2).

11. The conductive connecting member according to claim 10, wherein said conductive connecting member is a conductive bump to bond between the semiconductor device and another semiconductor device.

12. The conductive connecting member according to claim 10, wherein said conductive connecting member is a conductive die bonding portion to bond the semiconductor device and the conductive substrate.

13. The conductive connecting member according to claim 10, wherein said conductive paste is heat-treated under a pressurized condition of 0.5 to 15 Mpa between the electrode terminals or between the electrode terminal and the substrate.

14. The conductive connecting member according to claim 10, wherein said conductive paste is heat-treated at a temperature in a range from 150 to 350 degrees centigrade.

15. The conductive connecting member according to claim 10, wherein said conductive paste is heat-treated at a temperature in a range from 250 to 300 degrees centigrade.

16. The conductive connecting member according to claim 10, wherein said metal porous body has a porosity of 5 to 35%.

17. A conductive paste comprising:
metal fine particles (P) including metal fine particles (P1) and metal fine particles (P2), said metal fine particles (P1) being of one or more kinds selected from metals and/or alloys thereof, said metal fine particles (P1) having a mean primary particle diameter of 1 to 150 nm, said metal fine particles (P2) being of the same metals and/or alloys as those of the metal fine particles (P1), said metal fine particles (P2) having a mean primary particle diameter of 1 to 10 μm; and an organic dispersion medium (D) formed of an organic solvent (S) or a mixture of the organic solvent (S) and an organic binder (B), wherein said metal fine particles (P1) have a mass % of 80 to 95% relative to a total mass of the metal fine particles (P1) and the metal fine particles (P2), said metal fine particles (P1) are formed of Cu, said metal fine particles (P2) have a mass % of 5 to 20% relative to the total mass of the metal fine particles (P1) and the metal fine particles (P2), said organic solvent (S) includes an organic solvent (S1) that is capable of reducing a surface of the metal fine particles (P1), said organic solvent further includes an organic solvent (SA) having an amide group and a volume % of 5 to 95% relative to a total volume of the organic solvent (S1) and the organic solvent (SA), said organic solvent (S1) is formed of an alcohol or a polyalcohol having a boiling point of at least 100 degrees centigrade, said organic solvent (S1) has one or more hydroxyl groups within a molecule thereof and a carbon group bonded with the hydroxyl group having a (—CH(OH)—) structure, and said organic dispersion medium (D) has a mass % of 15 to 50% relative to a total mass of the metal fine particles (P) and the organic dispersion medium (D).

18. The conductive paste according to claim 17, wherein said organic dispersion medium (D) is formed of the organic solvent (S) having a mass% of 80 to 100% and the organic binder (B) having a mass % of 0 to 20% relative to a total mass of the organic solvent (S) and the organic binder (B).

19. The conductive paste according to claim 18, wherein said organic dispersion medium (D) further contains water (W), and
said water (W) has a mass % of 0.1 to 25% relative to a total mass of the organic solvent (S) and the water (W).

20. The conductive paste according to claim 17, wherein said organic solvent (S1) is formed of at least one selected from the group consisting of ethylene glycol, diethylene glycol, 1,2-propanediol, 1,3-propanediol, 1,2-butandiol, 1,3-butanediol, 1,4-butanediol, 2-butene-1,4-diol, 2,3-butanediol, pentanediol, hexanediol, octanediol, glycerol, 1,1,1-tris hydroxymethyl ethane, 2-ethyl-2-hydroxymethyl-1,3-propanediol, 1,2,6-hexanetriol, 1,2,3-hexanetriol, 1,2,4-butanetriol, 1,2,6-hexanetriol, 1,2,3-hexanetriol, 1,2,4-butanetriol, threitol, erythritol, pentaerythritol, pentitol, hexitol and iminodiethanol.

21. The conductive paste according to claim 17, wherein said organic solvent (SA) is formed of at least one selected from the group consisting of N-methylacetamide, N-methylformamide, N-methylpropaneamide, formamide, N,N-dimethylacetamide, 1,3-dimethyl-2-imidazolidinone, N,N-dimethylformamide, 1-methyl-2-pyrolidone, hexamethylphosphoric triamide, 2-pyrrolidinone, ε-caprolactam, and acetamide.

22. The conductive paste according to claim 17, wherein said organic binder (B) is formed of at least one selected from the group consisting of a cellulose resin binder, an acetate resin binder, an acrylic resin binder, a urethane resin binder, a polyvinilpyrroridone resin binder, a polyamide resin binder, a butyral resin binder, and a terpene binder.

23. The conductive paste according to claim 22, wherein said cellulose resin binder is formed of at least one selected from the group consisting of acetylcellulose, methyl cellulose, ethylcellulose, butylcellulose, and nitrocellulose, said acetate resin binder is formed of at least one selected from the group consisting of methyl glycol acetate, ethyl glycol acetate, butyl glycol acetate, ethyl diglycol acetate, and butyl diglycol acetate, said acrylic resin binder is formed of at least one selected from the group consisting of methyl methacrylate, ethyl methacrylate, and butylmethacrylate, said urethane resin binder is formed of at least one selected from the group consisting of 2,4-tolylenediisocyanate and p-phenylene diisocyanate, said polyvinilpyrroridone resin binder is formed of at least one selected from the group consisting of polyvinil pyrolidone and N-vinil pyrolidone, said polyamide resin binder is formed of at least one selected from the group consisting of polyamide 6, polyamide 66, and polyamide 11, said butyral resin binder is formed of polyvinil butyral, and said terpene binder is formed of at least one selected from the group consisting of pinene, cineol, limonene, and terpineol.

24. The conductive paste according to claim 17, wherein said organic solvent (S) and said organic binder (B) are vaporized or thermally decomposed when the conductive paste is heat-treated to form a metal porous body.

25. An conductive connecting member comprising:

a metal porous body formed of the conductive paste according to claim 17, wherein said conductive paste is mounted on one bonded surface of a semiconductor device in an electronic component, an electrode terminal of a circuit board, or a conductive substrate before other bonded surface of other electrode terminal or other conductive substrate to be connected is placed on the conductive paste, and heat-treated to be sintered, said metal porous body includes the metal fine particles (P1) situated between the metal fine particles (P2) and pores scattered between the metal fine particles (P1) and (P2).

26. The conductive connecting member according to claim 25, wherein said conductive connecting member is a conductive bump to bond between the semiconductor device and another semiconductor device.

27. The conductive connecting member according to claim 25, wherein said conductive connecting member is a conductive die bonding portion to bond the semiconductor device and the conductive substrate.

28. The conductive connecting member according to claim 25, wherein said conductive paste is heat-treated under a pressurized condition of 0.5 to 15 Mpa between the electrode terminals or between the electrode terminal and the substrate.

29. The conductive connecting member according to claim 25, wherein said conductive paste is heat-treated at a temperature in a range from 150 to 350 degrees centigrade.

30. The conductive connecting member according to claim 25, wherein said conductive paste is heat-treated at a temperature in a range from 250 to 300 degrees centigrade.

31. The conductive connecting member according to claim 25, wherein said metal porous body has a porosity of 5 to 35%.

* * * * *